United States Patent [19]

Schwee

[11] Patent Number: 4,962,477
[45] Date of Patent: Oct. 9, 1990

[54] ENHANCED CROSSTIE RANDOM ACCESS MEMORY ELEMENT AND A PROCESS FOR THE FABRICATION THEREOF

[75] Inventor: Leonard J. Schwee, Colesville, Md.

[73] Assignee: The United States of America as represented by the Secretary of the Navy, Washington, D.C.

[21] Appl. No.: 505,617

[22] Filed: Jun. 20, 1983

[51] Int. Cl.⁵ ............................................. G11C 19/08
[52] U.S. Cl. .................................................... 365/87
[58] Field of Search ................... 365/87, 171, 172, 173

[56] References Cited

U.S. PATENT DOCUMENTS

| | | | |
|---|---|---|---|
| 3,846,770 | 11/1974 | Schwee et al. | 340/174 F B |
| 3,868,659 | 2/1975 | Schwee | 340/174 T F |
| 3,868,660 | 2/1975 | Schwee | 340/174 T F |
| 4,100,609 | 7/1978 | Schwee et al. | 365/87 |
| 4,161,789 | 7/1979 | Torok et al. | 365/87 |
| 4,192,012 | 3/1980 | Schwee et al. | 365/87 |
| 4,231,107 | 10/1980 | Schwee et al. | 365/87 |
| 4,410,963 | 10/1983 | Lo et al. | 365/87 |
| 4,473,893 | 9/1984 | Zierhut et al. | 365/87 |

Primary Examiner—Theodore M. Blum
Attorney, Agent, or Firm—Kenneth E. Walden; John G. Wynn

[57] ABSTRACT

An enhanced random access memory element and a process for its fabrication, wherein permalloy thin films are patterned, inter alia, into a plurality of geminous memory cells to form a matrix or array of juxtaposed sloped columns thereof is disclosed. Each of the geminous memory cells is configured into a unique pattern comprising twin sub-patterns joined in an opposite fashion, i.e. reversed and inversed, so as to share a common area of permalloy. Consequently, magnetic domain walls (Néel walls) are formed at opposite and adjacent apexes of the unique pattern parallel to the easy axis after a predetermined magnetic field is applied along the hard axis of the array of geminous memory cells and then reduced to zero. In this way, the magnetization is properly aligned for use of the array of geminous memory cells as an enhanced nonvolatile random access memory element. Subsequent magnetization of the proper amount at particular ones of the geminous memory cells will cause two crossties and two Bloch lines to form therein so as to couple to each other, crosstie to Bloch line, Bloch line to crosstie. This configuration provides a larger readout signal, a larger signal to noise ratio, and will operate at lower power levels for the same density of information than previous crosstie random access memory elements.

8 Claims, 1 Drawing Sheet

ENHANCED CROSSITE RANDOM ACCESS MEMORY ELEMENT AND A PROCESS FOR THE FABRICATION THEREOF

CROSS-REFERENCES TO RELATED APPLICATIONS

Related applications assigned to the same assignee as the present invention are as follows:

U.S. patent application Ser. No. 386,389 to Schwee et al., entitled "Crosstie Random Access Memory Element and a Process for the Fabrication Thereof," filed June 8, 1982;

U.S. patent application Ser. No. 386,388 to Schwee, entitled "Crosstie Random Access Memory Element Having Associated Read/Write Circuitry," filed June 8, 1982; and U.S. patent application Ser. No. 386,367 to Schwee, entitled "Crosstie Random Access Memory System," filed June 8, 1982.

BACKGROUND OF THE INVENTION

1. Field of the Invention

The present invention relates to magnetic storage devices generally, but more specifically, the present invention relates to an enhanced crosstie random access memory element and a process for the production thereof.

2. Description of the Prior Art

Electronic computers and other data processing devices, to a great extent, are limited by the speed, capacity, and reliability of their memory systems. Memory systems currently in use include tiny ring shaped ferrite cores strung on a mesh of fine wires (core memories) and semiconductor memories comprising transistor circuits laid down on tiny chips of silicon. At the present time the most common nonvolatile random access memory (RAM) in use is core memory. However, core memories having large storage capacity become bulky, heavy and extremely expensive compared to memories which can be fabricated using photolithographic techniques such as the aforementioned semiconductor memories. Unfortunately, for the most part, dense, light weight semiconductor memories are volatile. The exception is MNOS semiconductor memories which take a relatively long time to write and read and have limited retentivity. Consequently, there is a need in the prior art to configure using photolithographic techniques a nonvolatile random access memory which is fast, but light in weight and low in cost.

In the prior art, an alternative to the foregoing memories stores data bits in the form of magnetic bubbles which move in thin films of magnetic material. The bubbles are actually cylindrical magnetic domains whose polarization is opposite to that of the thin magnetic film in which they are embedded. The bubbles are stable over a considerable range of conditions and can be moved from point to point at high velocity. Magnetic bubble memories are substantially cheaper than the core memories aforementioned, and much faster than magnetic disk memory systems which are widely used for high capacity storage. Magnetic bubble memories are analogous to magnetic disk memories in that in both systems data is stored as states on, or in, a thin magnetic film. In a disk memory, the film is moved mechanically at high speeds On the other hand, in a magnetic bubble memory, the bubbles move at high speeds throughout the thin magnetic film. As aformentioned, magnetic bubble memories are nonvolatile, hence, logical operations can be performed without reading or writing the stored data out/in again. Since, magnetic bubble memories do not have moving parts, they should operate reliably for long periods of time. However, a drawback of magnetic bubble memory devices is that single crystals with minimal defects are required for their fabrication. Moreover, it is difficult to produce large single crystals for high storage devices. Even the attempted use of amorphous materials does not eliminate the problem of high eddy currents which reduce the speed of the magnetic bubble domains. Even so, magnetic bubble memories have many advantages except that they are serial memories and the access time is long. Hence, there is a need in the prior art to configure a nonvolatile random access memory using thin magnetic film technology but yet be fast in access time and require the use of only polycrystalline material.

As further background material, the present invention is an outgrowth of the crosstie memory technology disclosed primarily in U.S. Pat Nos.: 3,846,770 to Schwee et al., entitled "Serial Access Memory Using Magnetic Domains in Thin Film Stripes," filed July 11, 1973, patented Nov. 5, 1974; U.S. Pat. No. 3,868,659 to Schwee, entitled "Serial Access Memory Using Thin Magnetic Films," filed Apr. 10, 1973, patented Feb. 25, 1975; 3,868,660 to Schwee, entitled "Detector for Cross-tie Memory," filed Apr. 10, 1973, patented Feb. 25, 1975; U.S. Pat. No. 4,100,609 to Schwee, et al., entitled "Magnetoresistance Detector for Crosstie Memories," filed Sept. 3, 1976, patented July 11, 1978; U.S. Pat. No. 4,192,012 to Schwee et al., entitled "Crosstie Memory Bit Stretcher Detector," filed Nov. 8, 1978, patented Mar. 4, 1980; and U.S. Pat. No. 4,231,107 to Schwee et al., entitled "Serriform Strip Crosstie Memory," filed Feb. 14, 1978, patented Oct. 28, 1980, all patents being assigned to the same assignee as the present invention.

Briefly, Schwee et al,, '770 disclose a polycrystalline thin film strip for storing digital information serially in the form of reversal domains. The reversal domains are propagated along the thin film strip, e.g., of permalloy, and then sensed to detect the stored digital information.

Schwee, '659, discloses a serial access memory based on the propagation of crossties and Bloch lines along domain walls in thin magnetic films. Variation of the current through conductors placed above the domain walls changes the fields along the walls which causes propagation of the information contained in inverted Neel walls along the domain walls.

Schwee et al., '107, discloses a crosstie memory using a plurality of permalloy thin film strips of uniform thickness each strip having parallel denticulated margins etched to align with the oblong axis thereof. Each pair of opposite denticles defines a distinct memory cell.

The other patents listed above are cited to show additional prior art of crosstie memory development, and the development of certain types of detectors for use therewith. All of the listed patents and related applications are incorporated herein by reference.

The cited and discussed patents and related applications do disclose certain versions and particular aspects of crosstie memories. But they do not disclose or teach, *inter alia,* the placing of magnetic domain walls into a matrix or array configuration using the unique patterns of the present invention thereby creating an enhanced random access memory element The prior art, as indicated hereinabove, teaches some advances in crosstie memories including devices for detecting or reading-out binary information therefrom. However, insofar, as can be determined, no prior art device or process incorporates the features and advantages of the present invention

OBJECTS OF THE INVENTION

Accordingly, a principal object of the present invention is to configure an enhanced nonvolatile random access memory element having high bit density so as to be substantially faster and lighter in weight than present nonvolatile random access memories, but yet be lower in cost.

A corollary object of the above principal object is to configure the enhanced nonvolatile random access memory element using thin magnetic film and photolithographic techniques, but yet be faster in access time than magnetic bubble memories while requiring only polycrystalline material for the fabrication thereof Another object of the present invention is to configure the enhanced nonvolatile random access memory element on a silicon substrate so as to be compatible with present day integrated circuit fabrication.

A corollary object of the above object is to configure the enhanced nonvolatile random access memory element so that a significant number of its masking levels can be folded in with the masking levels needed to connect transistors for the decoding and driving thereof.

Yet another object of the present invention is to configure the enhanced nonvolatile random access memory element to have non-destructive readout, but yet be low in cost.

Still another object of the present invention is to configure the enhanced nonvolatile random access memory element to have high bit density, but yet not generate excessive heat thereby eliminating the need for elaborate heat sinking.

A further object of the present invention is to configure the enhanced nonvolatile random access memory element to be resistant to radiation, but still be fast and low in cost.

SUMMARY OF THE INVENTION

In accordance with the above stated objects, the present invention has as a primary purpose the fabrication of an enhanced nonvolatile random access memory element having a high bit density that is fast and low in cost for use in computers, or with microprocessors and signal processors.

The essence of the present invention is in the use of permalloy thin films to configure a geminous memory cell portion of the enhanced nonvolatile random access memory element to comprise two crossties and two Bloch lines, the magnetic domain walls (Néel walls) being disposed so that the two crossties and the two Bloch lines are coupled to each other, i.e., crosstie to Bloch line, Bloch line to crosstie. Consequently, the enhanced nonvolatile random access memory element is fabricated by placing and forming the Néel walls in the permalloy into a matrix or array configuration.

The purpose of the present invention is carried out by depositing a first level of permalloy (81—19 Ni—Fe) onto the oxide layer of a silicon substrate. The permalloy film is then etched into a plurality of juxtaposed sloped columns of the geminous memory cell portions to form a matrix or array thereof. Each geminous memory cell portion of the enhanced nonvolatile random access memory element is configured into a unique pattern comprising twin sub-patterns joined in an opposite fashion, i.e., reversed and inversed, so as to share a common area of permalloy. The magnetic domain walls are formed at opposite and adjacent apexes of the pattern in each geminous memory cell portion after a predetermined magnetic field is applied along the hard axis of the geminous memory cell array and then reduced to zero. In this way, the magnetization is aligned properly for use of the geminous memory cell portions as a nonvolatile random access memory element. Each geminous memory cell portion in the array is connected so that current can be passed through each juxtaposed sloped column of the array for magnetoresistance readout. A second level comprises an insulator of silicon nitride or silicon monoxide having vias for connection to the permalloy columns of the array. A third level of 95—5 Al—Cu is deposited so as to fabricate a plurality of juxtaposed row conductors which cross the permalloy columns of the array but above corresponding geminous memory cell portions of the juxtaposed sloped columns. These conductors form row address lines for reading/writing operations. A fourth level comprises another insulator layer having vias for connection to individual row address lines. A fifth level of 95—5 Al—Cu is deposited so as to fabricate a plurality of column conductors shaped like "Zs" which "meander" above corresponding columns of the array traversing each geminous memory cell portion therein in the same direction. These conductors form column address lines for the writing operation since writing is accomplished using coincident currents.

BRIEF DESCRIPTION OF THE DRAWINGS

The foregoing and other objects, novel features, and advantages of the present invention will be more apparent from the following more particular description of the preferred embodiment as illustrated in the accompanying drawings, in which.

DESCRIPTION OF THE PREFERRED EMBODIMENT

Figure 1:
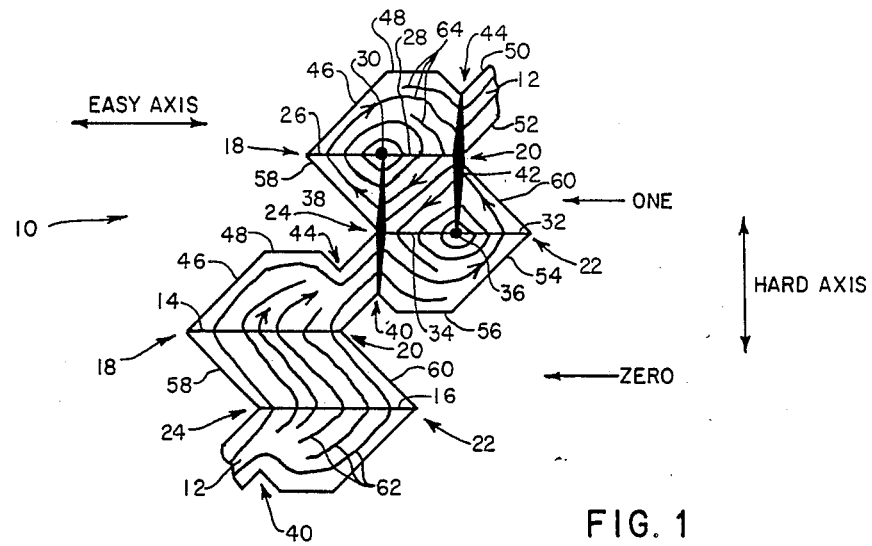
FIG. 1 depicts the unique pattern shape of a geminous memory cell(s), and illustrates the directions of magnetization for a logic "zero" and a logic "one", according to the present invention.

The following is a description of an enhanced nonvolatile crosstie random access memory element employing the present invention. A process for fabricating the enhanced nonvolatile crosstie random access memory element along with the operation thereof is discussed in the "Statement of the Operation" hereintofollow Referring then to FIG. 1, the configuration of a plurality of geminous memory cells 10 of a polycrystalline magnetic material such as a permolloy thin film 12 is illustrated. Also illustrated by the lines and arrows, is the direction of magnetization for a logic "zero" and a logic "one" for respective ones of the geminous memory cells 10. The etching of the permalloy thin film 12 into a unique pattern of connected geminous memory cells 10 is an important contribution of the present invention. The one of geminous memory cells 10 containing the logic "zero" condition includes adjacent unipolar Néel walls 14 and 16 parallel to each other and to the 22 easy axis. The unipolar Néel wall 14 extends between one of a plurality of left outside apexes 18 and a corresponding one of a plurality of right inside apexes 20. Contrariwise, the unipolar N/E,acu/e/ el wall 16 extends between one of a plurality of right outside apexes 22 and a corresponding one of a plurality of left inside apexes 24. The one of the geminous memory cells 10 containing the logic "one" includes a left positive Néel wall portion 26 and a right negative Néel wall portion 28. The left positive Néel wall portion 26 extends between another one of the left outside apexes 18 and a top Bloch line 30 which is a line of magnetic flux extending perpendicular to the plane of the permalloy thin film 12. The right negative Néel wall 28 extends between the aforementioned top Bloch line 30 and a corresponding one of the right inside apexes 20. The one of the geminous memory cells 10 containing the logic "one" further includes a right positive Néel wall portion 32 and a left negative Néel wall portion 34. The right positive Néel portion 32 extends between another one of the right outside apexes 22 and a bottom Bloch line 36 which also is a line of magnetic flux extending perpendicular to the plane of the permalloy thin film 12. The left negative Néel wall extends between the aforementioned bottom Bloch line 36 and a corresponding one of the left inside apexes 24. All of the aforementioned Néel wall portions are disposed parallel to the easy axis as shown. In this same one of the geminous memory cells 10, a left crosstie 38 extends from the top Bloch line 30 through one of the left inside apexes 24 to one of a plurality of bottom glitches of permalloy 40. In addition, a right crosstie 42 extends from the bottom Bloch line 36 through one of the right inside apexes 20 to one of a plurality of top glitches of permalloy 44. The aforementioned crosstie pair 38 and 42 are substantially parallel to each other and the hard axis as shown.

Still referring to FIG. 1, the unique pattern is further formed by etching permalloy thin film 12 to include a plurality of left top acute edges of permalloy 46 each joined to corresponding ones of a plurality of substantially parallel to the easy axis top edges of permalloy 48 which, in turn, join corresponding ones of the aforementioned top glitches of permalloy 44. Each of a plurality of top short edges of permalloy 50 extends acutely from corresponding ones of top glitches of permalloy 44 to corresponding ones of the left inside apexes 24. Each of a plurality of bottom short edges of permalloy 52 extends acutely from corresponding ones of the bottom glitches of permalloy 40 to corresponding ones of right apexes 20.

The unique pattern is still further formed and defined by etching the permalloy thin film 12 to include a plurality of right bottom acute edges of permalloy 54 each joined to corrsponding ones of a plurality of substantially parallel to the easy axis bottom edges of permalloy 56 which, in turn, join corresponding ones of the aforementioned bottom glitches of permalloy 40. As shown, the unique pattern comprises twin sub-patterns defined by edges of permalloy 46, 48, 50 and 52 in a top sub-pattern, and by edges of permalloy 54, 56 and other ones of edges of permalloy 50 and 52 in a bottom sub-pattern. The top and bottom sub-patterns are connected by a common area of permalloy defined by one of a plurality of left obtuse edges of permalloy 58, a plurality of right obtuse edges of permalloy 60 and the aforementioned Néel walls 14 and 16 for example.

The size of the unique pattern is scaled such that the Néel walls 32 and 26, for example, are 2.5 to 10 microns apart. All other dimensions of the unique pattern are scaled in proportion

STATEMENT OF THE OPERATION

Figure 2:
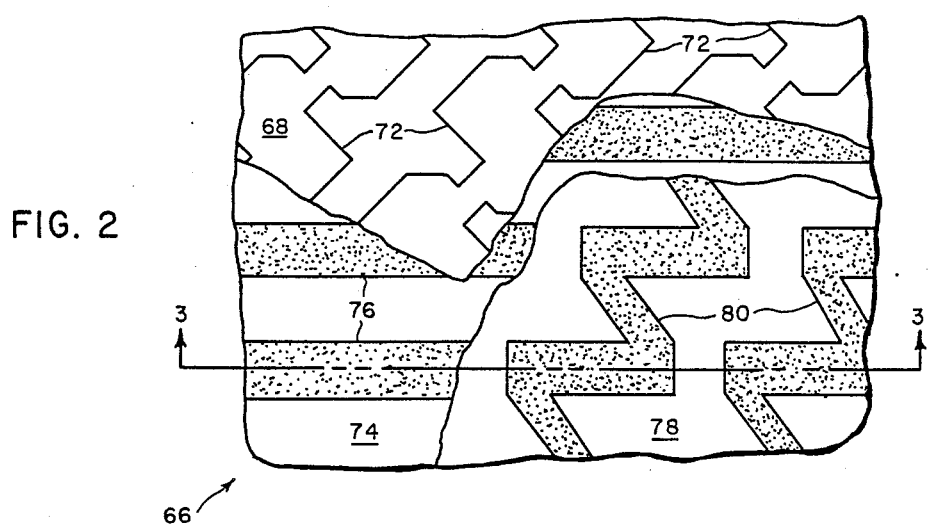
FIG. 2 is a fragmented top plan view of the enhanced nonvolatile crosstie random access memory element including, inter alia, an array of the geminous memory cells of FIG. 1, a level of row conductors and a level of "meandering""Z" shaped column conductors.
Figure 3:
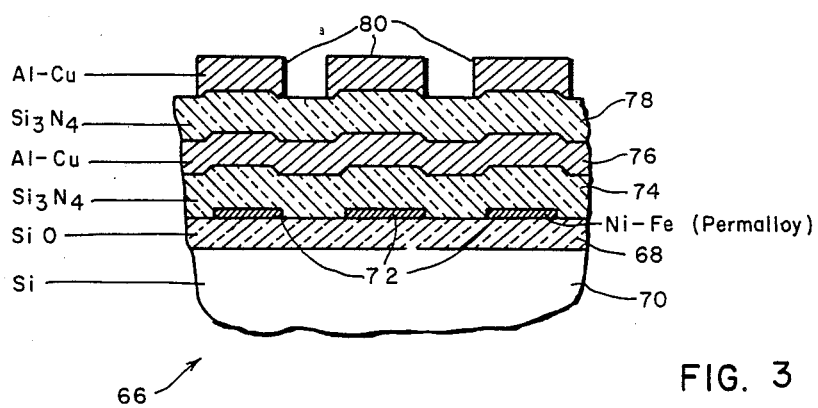
FIG. 3 is a cross sectional view depicting additional levels of fabrication of the enhanced nonvolatile crosstie random accesss memory element of FIG. 2 taken along lines 3—3 thereof.

Details of the operation according to a preferred embodiment of the present invention and some aspects of its fabrication are explained in conjunction with FIGS. 1, 2 and 3.

As further illustrated in FIG. 1, when a positive magnetic field of about 100 Oe is applied along the hard axes in the plane of permalloy thin film 12 (in an upward direction) and then reduced to zero, the magnetization as depicted by vectors 62 is properly aligned for use as a memory, and a logic "zero" will be present in all of the geminous memory cells 10. The magnetization aligns itself parallel to the edges of the shape of permalloy thin film 12 to decrease magnetostatic energy. The edges influence the magnetization direction for several microns from each edge. The distance between geminous memory cells 10 is about 20 microns. Now if a negative field of about 11 Oe is applied along the hard axis in the plane of permalloy thin film 12 (in a downward direction) and then reduced to zero, crosstie pairs will appear in all of the plurality of geminous memory cells 10. This magnetization is depicted by vectors 64. Consequently, the presence of a crosstie pair 38 and 42 and a corresponding Bloch line pair 30 and 36 is considered a logic "one" and the absence thereof a logic "zero". It should be mentioned that the magnetization directions as represented by vectors 62 and 64 remain parallel and in the same directions along the edges of the respective geminal cells 10, whether a logic "one" or logic "zero" is present. The predictable behavior of any one of the geminous memory cells 10 is predicated on the foregoing facts.

To eliminate the crosstie/Bloch line pairs, a positive field of about 10 Oe is required. As the field is applied, the top Bloch line 30 approaches the right crosstie 42, by which it is repulsed, until contact is made and annihilation occurs. Concurrently, the bottom Bloch line 36 approches the left crosstie 38 with the same result. Then the field can be returned to zero and a logic "zero" will be present. At zero applied field a logic "one" or a logic "zero" is stable.

Referring now to FIGS. 2 and 3 concurrently, plan and sectional views, respectively, of a preferred arrangement of a matrix or array of geminous memory cells (enhanced nonvolitile crosstie random access memory element) 66 suitable for read and write operations are shown. A first level of memory element 66 is deposited on a suitable substrate comprising a silicon oxide layer 68 which has been grown on a silicon substrate 70. This first level comprises a plurality of juxtaposed sloped columns of memory cells 72 comprising the geminous memory cells 10 of permalloy thin film 12 (see FIG. 1). This first level of memory element 66 is fabricated by first depositing 81—19 Ni—Fe using a physical vapor deposition process (either resistance heating, induction heating or electron beam heating) or a sputtering process. This layer is patterned with the unique pattern using conventional photolithgraphic techniques and then etched chemically or with an ion beam mill. A second level of memory element 66 comprises an insulator layer 74 of silicon nitride or silicon monoxide having vias (not shown) for making connections to the juxtaposed sloped columns of memory cells 72. The vias in this level are created using a liftoff technique whereby photoresist plugs are removed in a heated acetone bath agitated with an ultra sonic agitator. This technique is believed to give superior stripping of the photoresist. A third level comprises a plurality of juxtaposed rows of conductors 76 of 95—5 Al—Cu. The conductors 76 are fabricated to traverse adjacent and corresponding geminous memory cells 10 (see FIG. 1) of juxtaposed sloped columns of memory cells 72. These conductors form the row read/write address lines for memory element 66. This level is fabricated using a liftoff process also. The pattern created is such that only areas of this level which are not to have Al—Cu on them are covered with photoresist and all other areas are left clear. The Al—Cu is then deposited in an ion beam coater. Then the metalization is created by removing the photoresist on the areas intended to be free of metal by also using heated acetone in an ultra sonic agitator. A fourth level of memory element 66 comprises an insulator layer 78 also of silicon nitride or silicon monoxide and also having vias (not shown) for connection individually to the juxtaposed rows of conductors 76. This processing step is substantially the same as the step for the fabrication of level two. A fifth level comprises a plurality of juxtaposed meandering columns of conductors 80 shaped like "Zs" also of 95—5 Al—Cu. The "Z" shaped conductors 80 are fabricated to follow the slope of corresponding ones of the juxtaposed sloped columns of memory cells 72 meandering up each column crossing above each one of the geminous memory cells 10 (see FIG. 1) thereof in the same direction. This processing step is substantially the same as the step for the fabrication of level three. These "Z" shaped meandering conductors 80 form the column write address lines for memory element 66.

For purposes of the present invention, the silicon oxide layer 68 is about 2000Å thick, the first level of juxtaposed sloped columns of memory cells 72 is about 400Å the second level of insulator layer 74 is about 2000 Å, the third level of juxtaposed rows of conductors 76 is about 2000 Å, the fourth level of insulator layer 78 is about 2000 Å, and the fifth level of juxtaposed meandering columns of conductors 80 is about 3000 Å. Note that these meandering column conductors are deposited about 1000 Å thicker than the row conductors to compensate for the increase in resistance due to the longer meandering current path required.

The desired properties of magnetic materials suitable for use with the present invention are zero magnetostriction H, $H_k$ 3.5 Oe, $H_c$ 1 to 1.5 Oe, and the magnetostriction ratio, $R/R_o$ greater than 3.3%. Isotropic films may also be used in the fabrication of the present invention. In addition, the easy axis and the hard axis can be reversed.

To these skilled in the art, many modifications and variations of the present invention are possible in light of the above teachings. It is therefore to be understood that the present invention can be practiced otherwise than as specifically described herein and still be within the spirit and scope of the appended claims.

What is claimed is:

1. An enhanced crosstie random access memory element comprising:
    a substrate;
    a first level of polycrystalline magnetic material disposed on the top of said substrate and being configured into a plurality of juxtaposed sloped columns of geminous memory cells to form an array thereof, each one of said plurality of juxtaposed sloped columns of geminous memory cells being configured into a unique pattern of connected geminous memory cells;
    a second level of insulating material disposed on the top of said first level and having vias for connecting through to each one of said plurality of juxtaposed sloped columns of geminous memory cells;
    a third level of conducting material disposed on top of said second level and being configured into a plurality of juxtaposed row conductors which cross the array comprising said plurality of juxtaposed sloped columns of geminous memory cells above corresponding geminous memory cells thereof;
    a fourth level of insulating material disposed on top of said third level and having vias for connecting through to each one of said plurality of juxtaposed row conductors; and
    a fifth level of conducting material disposed on top of said fourth level and being configured into a plurality of juxtaposed meandering columns of "Z" shaped conductors each one being fabricated so as to follow the slope of corresponding ones of said juxtaposed sloped columns of geminous memory cells traversing above each geminous memory cell therein.

2. The enhanced crosstie random access memory element of claim 1 wherein each of said geminous memory cells is configured into twin sub-patterns joined in an opposite, reversed and inversed, fashion so as to share a common area of the polycrysyalline magnetic material.

3. The enhanced crosstie random access memory element of claim 2 wherein the unique pattern is scaled such that corresponding magnetic domain walls of each of the sub-patterns, when formed at opposite and ajacent apexes thereof, are 2.5 to 10 microns apart.

4. The enhanced crosstie random access memory element of claim 3 wherein said substrate comprises a silicon oxide layer grown on a silicon substrate.

5. The enhanced crosstie random access memory element of claim 4 wherein said first level of polycrystalline magnetic material comprises permalloy of 18—19 Ni—Fe; and wherein the thickness thereof is about 400 Å.

6. The enhanced crosstie random access memory element of claim 5 wherein said second and fourth levels of insulating material comprise silicon nitride having a thickness at each level of about 2000 Å.

7. The enhanced crosstie random access memory element of claim 6 wherein said third level of conducting material comprises 95—5 Al—Cu having a thickness of about 1000 Å.

8. The crosstie random access memory element of claim 7 wherein said fifth level of conducting material comprises 95—5 Al—Cu having a thickness of about 3000 Å.

* * * * *